(12) United States Patent
Nakamura et al.

(10) Patent No.: US 9,653,678 B2
(45) Date of Patent: May 16, 2017

(54) MAGNETIC MEMORY, MAGNETIC MEMORY DEVICE, AND OPERATION METHOD OF MAGNETIC MEMORY

(71) Applicant: KABUSHIKI KAISHA TOSHIBA, Tokyo (JP)

(72) Inventors: Shiho Nakamura, Kanagawa (JP); Yasuaki Ootera, Kanagawa (JP); Takuya Shimada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 14/562,790

(22) Filed: Dec. 8, 2014

(65) Prior Publication Data

US 2015/0255710 A1    Sep. 10, 2015

(30) Foreign Application Priority Data

Mar. 10, 2014 (JP) .................. 2014-046854

(51) Int. Cl.
*H01L 43/08* (2006.01)
*H01L 43/02* (2006.01)
*G11C 11/16* (2006.01)

(52) U.S. Cl.
CPC ............ *H01L 43/08* (2013.01); *G11C 11/161* (2013.01); *G11C 11/1659* (2013.01); *G11C 11/1673* (2013.01); *G11C 11/1675* (2013.01); *H01L 43/02* (2013.01); *G11C 2213/71* (2013.01)

(58) Field of Classification Search
CPC ..... H01L 43/02; H01L 43/08; G11C 11/1673; G11C 11/1675
See application file for complete search history.

(56) References Cited

U.S. PATENT DOCUMENTS

| | | | |
|---|---|---|---|
| 6,834,005 B1 | 12/2004 | Parkin | |
| 7,860,351 B2 * | 12/2010 | Yagami | ................. B82Y 25/00 360/313 |
| 8,130,530 B2 * | 3/2012 | Pi | ....................... G11C 19/0841 365/171 |
| 8,934,289 B2 * | 1/2015 | Annunziata | ......... G11C 11/1675 365/148 |
| 2012/0008362 A1 | 1/2012 | Joseph et al. | |
| 2012/0250398 A1 * | 10/2012 | Morise | .............. G11C 19/0841 365/157 |
| 2014/0140126 A1 | 5/2014 | Morise et al. | |

FOREIGN PATENT DOCUMENTS

| | | |
|---|---|---|
| JP | 2005-353819 | 12/2005 |
| JP | 2007-73103 | 3/2007 |
| JP | 2011-181642 | 9/2011 |
| JP | 2014-103260 | 6/2014 |

* cited by examiner

*Primary Examiner* — Tri Hoang
(74) *Attorney, Agent, or Firm* — Finnegan, Henderson, Farabow, Garrett & Dunner LLP

(57) ABSTRACT

A magnetic memory includes a magnetic thin line including a plurality of magnetic domains, a reference layer having a magnetization, a nonmagnetic layer, a first fixed magnetization part having a magnetization, a second fixed magnetization part having a magnetization, a first electrode, a second electrode, and a third electrode.

17 Claims, 9 Drawing Sheets

FIG. 7A
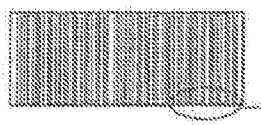
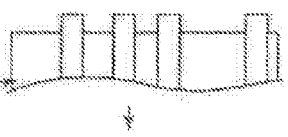
FIG. 7B
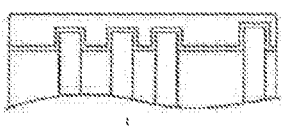
FIG. 7C
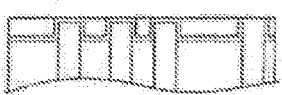
FIG. 7D
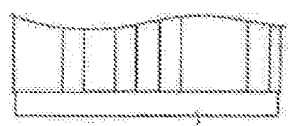
FIG. 7G
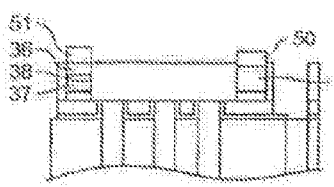
FIG. 7F
FIG. 7E

MAGNETIC MEMORY, MAGNETIC MEMORY DEVICE, AND OPERATION METHOD OF MAGNETIC MEMORY

CROSS-REFERENCE TO RELATED APPLICATION

This application is based upon and claims the benefit of priority from Japanese Patent Application No. 2014-046854, filed Mar. 10, 2014; the entire contents of which are incorporated herein by reference.

FIELD

Embodiments described herein relate to a magnetic memory, a magnetic memory device, and operation of a magnetic memory.

BACKGROUND

A three-dimensional memory using a magnetic domain wall has been proposed for realizing a large capacity memory. This three-dimensional memory includes a magnetic thin line, a reading part, and a writing part. The three-dimensional memory has a structure enabling adjustment of a position of the magnetic thin line, the reading part, and the writing part.

DESCRIPTION OF THE DRAWINGS

FIGS. 7A-7G are a diagram for showing a fabrication method of a magnetic memory;

DETAILED DESCRIPTION

Figure 1:
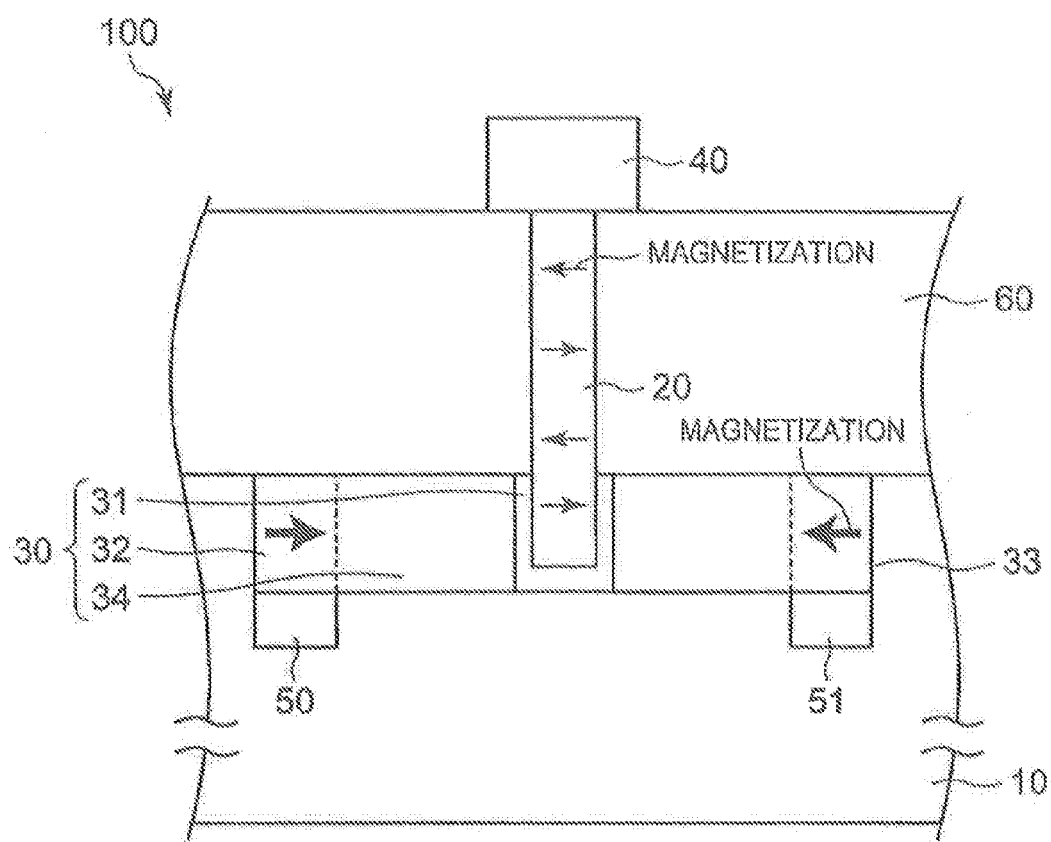
FIG. 1 is a diagram for showing a magnetic memory according to an embodiment of the present invention.

Hereinafter, with reference to the accompanying drawings, embodiments will be described. What is given the same reference numeral indicates the same component. It is noted that the drawings are schematic or conceptual and that a relationship between a thickness and a width of each portion and a ratio coefficient of sizes between the portions are not necessarily the same as those of actual things. Moreover, even when the same portion is shown, there is also a case where it is shown with different sizes and ratio coefficients depending on the drawings.

FIG. 1 shows a cross-sectional diagram of a magnetic memory 100. The magnetic memory 100 is provided on a substrate 10. An arrow in FIG. 1 shows a magnetization. The substrate 10 can include an integrated circuit.

The magnetic memory 100 includes a magnetic thin line 20 and a writing/reading part 30. The writing/reading part 30 includes a nonmagnetic layer 31 and a reference layer 34 including a first fixed magnetization part 32 and a second fixed magnetization part 33.

The magnetic thin line 20 stores data. The magnetic thin line 20 is formed of a thin line of magnetic material. The magnetic thin line 20 extends in a direction normal to a surface of the substrate 10. The magnetic thin line 20 has a plurality of magnetic domains. An electrode 40 is provided on one end of the magnetic thin line. The other end of the magnetic thins line 20 is surrounded by the nonmagnetic layer 31.

A cross-sectional shape of the magnetic thin line 20 is rectangular, square, circular, or elliptical. A nonmagnetic material can be buried in a center of the cross-sectional shape of the magnetic thin line 20. The width of the magnetic thin line 20 is not less than 0.5 nm and not more than 500 nm. This width corresponds to a size in a direction perpendicular to an extending direction of the magnetic thin line 20. A length of the magnetic thin line 20 in the extending direction is not less than 50 nm and not more than 100 μm. However, this length depends on an amount of storage capacity of the magnetic memory 100.

A material containing at least one element selected from a group of cobalt (Co), iron (Fe), nickel (Ni), manganese (Mn), and chrome (Cr) can be used for the magnetic thin line 20. A combination alloy related to these materials can be also used for the magnetic thin line 20. Furthermore, a multilayer structure including a material containing at least one element selected from these elements can be used for the magnetic thin line 20.

A magnetization of the magnetic thin line 20 can be in a direction perpendicular to the extending direction of the magnetic thin line 20. A rare earth-transition metal amorphous alloy film such as TbFeCo or the like of an alloy of rare earth-transition metal and 3d transition metal can be used for the magnetic thin line 20. A multilayer structure such as Co/Ni multi layer or Co/Pd multilayer can be used for the magnetic thin line 20. By using these materials, a film forming the magnetic thin line 20 has a perpendicular magnetic anisotropy in which a magnetization easy axis is in a direction perpendicular to a side wall including the extending direction of the magnetic thin line 20. Furthermore, the magnetization of the magnetic thin line 20 can be in a direction perpendicular to the extending direction of the magnetic thin line 20. The magnetization easy axis of the magnetic thin line 20 can be in a direction perpendicular to the extending direction of the magnetic thin line 20 by using magnetostriction or arranging a crystal orientation of the magnetic thin line 20. The magnetization of the magnetic thin line 20 can have a different angle in a plane perpendicular to the extending direction of the magnetic thin line 20 and a direction perpendicular to the extending direction of the magnetic thin line 20. The nonmagnetic layer 31 is surrounded by the reference layer 34. MgO can be used for the nonmagnetic layer 31. The thickness of the nonmagnetic layer 31 is not less than 0.4 nm and not more than 20 nm. An oxide or nitride serving as a tunnel barrier can be used for the nonmagnetic layer 31. By using the oxide or nitride for the nonmagnetic layer 31, a storage capacity can be increased because the thickness of the nonmagnetic layer 31 can be thin. At least one material selected from a group of copper, silver, gold, aluminum, and platinum can be used for the nonmagnetic layer 31. A combination alloy related to these materials can be used also for the nonmagnetic layer 31. By using these metals, fabrication of the magnetic memory 100 is facilitated because the thickness of the nonmagnetic layer 31 can be thick. Graphite including graphene can be used for the nonmagnetic layer 31.

The first fixed magnetization part 32 and the second fixed magnetization part 33 are positioned at both ends of the reference layer 34, respectively. The first fixed magnetization part 32 and the second fixed magnetization part 33 can be formed separated from the reference layer 34. A thickness of the reference layer 34 is not less than 0.4 nm and not more than 100 nm. A size of the reference layer 34 can be expanded in a parallel direction to a surface of the substrate 10 because the reference layer 34 is provided parallel to the surface of the substrate 10. By expanding the size, the size of the reference layer 34 can be larger than the width of the magnetic thin line 20. For this reason, the position adjustment of the magnetic thin line and the reading/writing part 30 can be performed easily. The size of the reference layer 34 is not less than 0.6 nm and not more than 20 μm in a direction parallel to the surface of the substrate 10.

A material containing at least one element selected from a group of cobalt (Co), iron (Fe), nickel (Ni), manganese (Mn), and chrome (Cr) can be used for the reference layer 34. A combination alloy related to these elements can be used for the reference layer 34. A magnetization of reference layer 34 can be in a direction parallel to the surface of the substrate 10. The magnetization of the reference layer 34 can be in a direction perpendicular to a direction connecting from the first fixed magnetization part 32 to the second fixed magnetization part 33.

A magnetization of the first fixed magnetization part 32 is in a opposite direction to a magnetization of the second fixed magnetization part 33. This state of magnetization is referred to herein as antiparallel. The magnetization of the first fixed magnetization part 32 and the magnetization of the second fixed magnetization part 33 are parallel or antiparallel toward the magnetization of the magnetic thin line 20. Materials of the first fixed magnetization part 32 and the second fixed magnetization part 33 can be the same material as that used for the reference layer 34. To realize an antiparallel state, the material of the first fixed magnetization part 32 or the material of the second fixed magnetization part 33 is modified, or ion-irradiation can be adapted for either the first fixed magnetization part 32 or the second fixed magnetization part 33. By modification or treatment, a magnetic anisotropy of the first fixed magnetization part 32 and a magnetic anisotropy of the second fixed magnetization part 33 can be changed with each other, and the first fixed magnetization part 32 and the second fixed magnetization part 33 can have different coercive forces from each other.

The antiparallel state can be realized by changing a combination of a sign of spin polarization of the first fixed magnetization part 32 and a sign of spin polarization of the second fixed magnetization part 33. For example, a rare-earth (for example, Tb or Gd) rich rare earth-3d transition metal alloy can be used for the first fixed magnetization part 32, and a 3d-transition metal (for example, Fe, Co, or Ni)-rich rare earth-3d transition metal alloy is used for the second fixed magnetization part 33. After that, the magnetization of the first fixed magnetization part 32 and the magnetization of the second fixed magnetization part 33 are initialized by applying an external magnetic field to the first fixed magnetization part 32 and the second fixed magnetization part 33.

An electrode 50 is provided directly on the first fixed magnetization part 32. An electrode 51 is provided directly on the second fixed magnetization part 33. The electrodes 50, 51 are used for writing and reading for the magnetic memory 100 or moving the magnetic domain wall in the magnetic thin line 20 by passing an electric current.

Figure 2A:
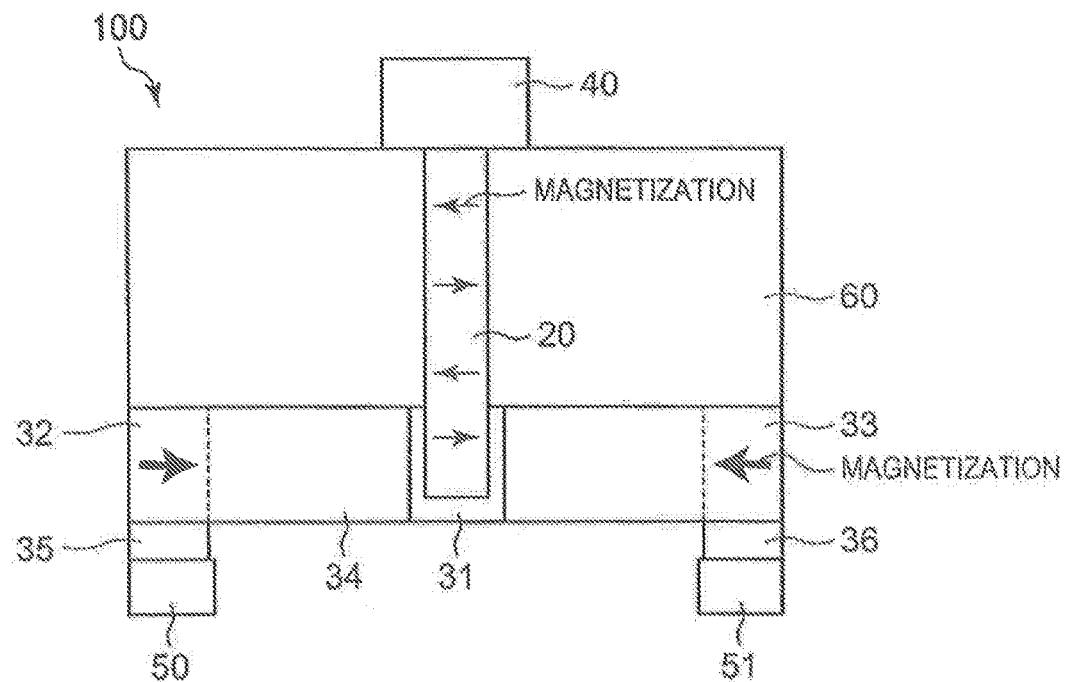
FIG. 2A is a diagram for showing a magnetic memory according to an embodiment of the present invention.

As shown in FIG. 2A, a first antiferromagnetic layer 35 can be provided between the first fixed magnetization part 32 and the electrode 50, and a second antiferromagnetic layer 36 can be provided between the second fixed magnetization part 33 and the electrode 51. If the Neel temperature of the first antiferromagnetic layer 35 is different from the Neel temperature of the second antiferromagnetic layer 36, the magnetization of the first fixed magnetization part 32 and the magnetization of the second fixed magnetization part 33 can be antiparallel.

Figure 2B:
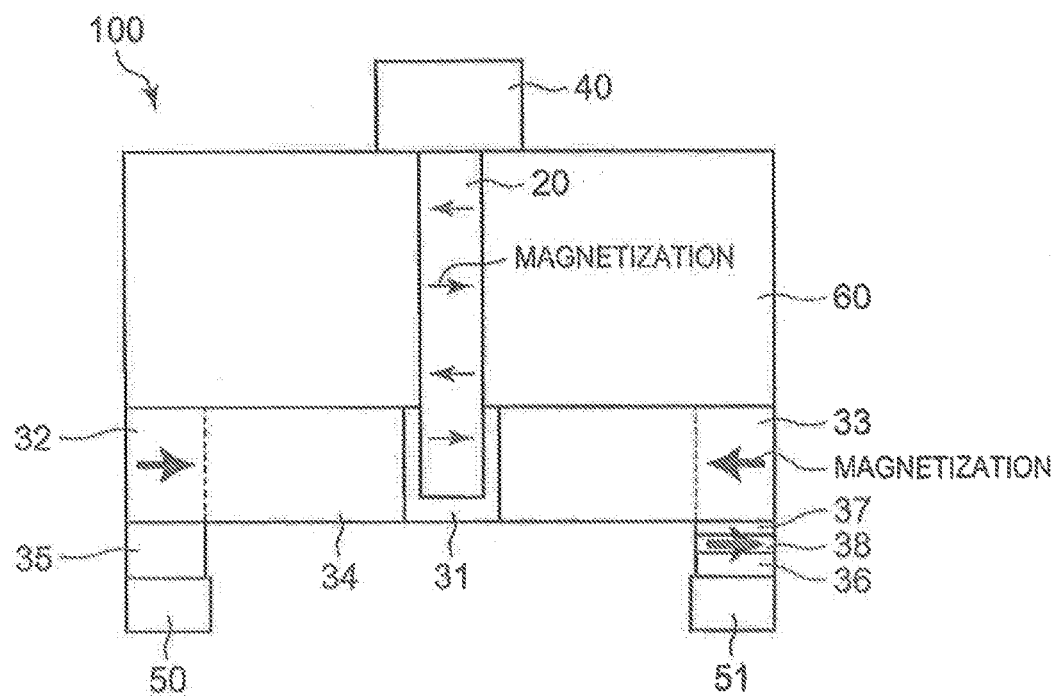
FIG. 2B is a diagram for showing a magnetic memory according to an embodiment of the present invention.

As shown in FIG. 2B, a nonmagnetic layer 37 such as Ru or the like and a magnetic layer 38 can be provided between the second fixed magnetization part 33 and the second antiferromagnetic layer 36. By doing this, the magnetization of the first fixed magnetization part 32 and the magnetization of the material of the second fixed magnetization part 33 can be antiparallel.

A space between the electrode 40 and the nonmagnetic layer 31 is surrounded by an insulating layer 60. Oxide such as alumina, silicon oxide, nitride such as silicon nitride, or insulated polymer can be used for the insulating layer 60. The magnetic thin line 20 can be fabricated by forming a trench in a thick dielectric material stacked on a substrate with lithography and reactive ion etching, and forming a magnetic film by the ALD method or the CVD method, and forming a thin line by processing the formed magnetic film.

A surface of the reference layer 34 is parallel to the surface of the substrate 10.

An electric current is provided by the electrode 40 to the magnetic thin line 20.

Operation of the magnetic memory 40 is explained next.

Figure 3A:
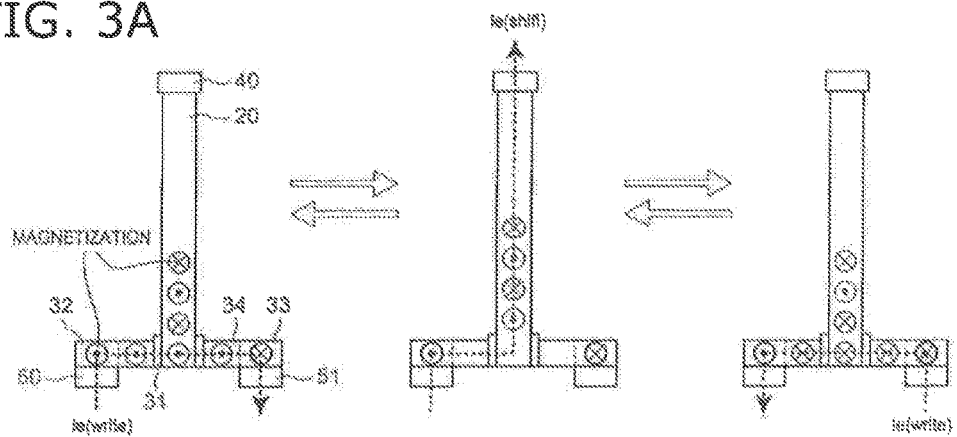
FIG. 3A is a diagram for showing a writing operation of a magnetic memory.
Figure 3B:
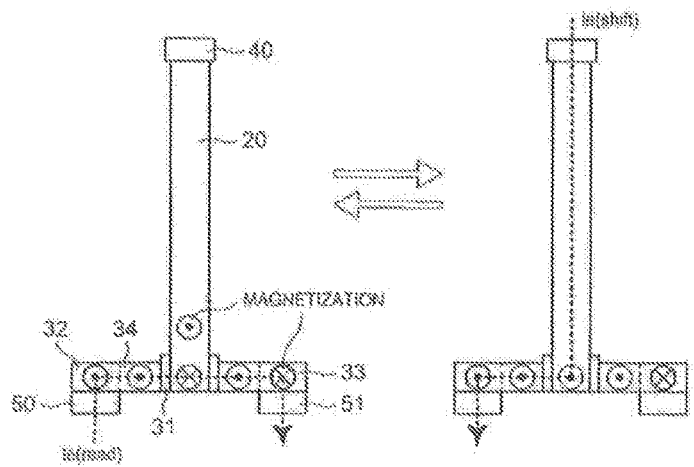
FIG. 3B is a diagram for showing a reading operation of a magnetic memory.
Figure 3C:
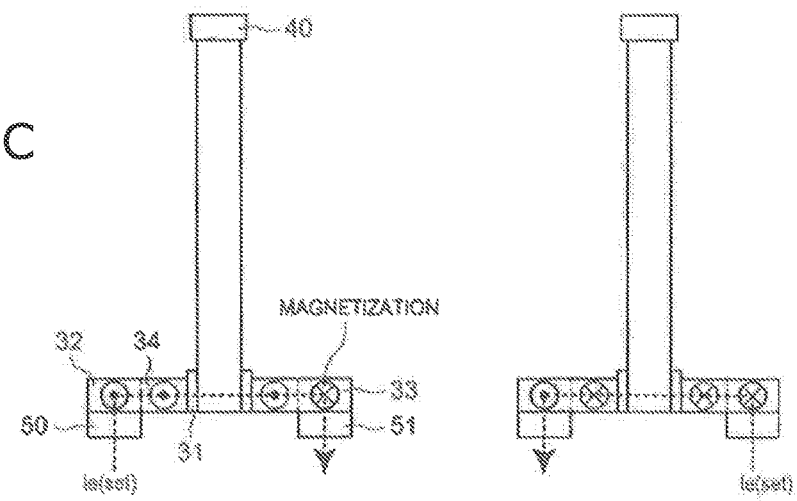
FIG. 3C is a diagram for showing a reading operation of a magnetic memory.

FIG. 3A, FIG. 3B, and FIG. 3C are diagrams for explain in the operation of the magnetic memory 100.

FIG. 3A is a diagram showing a writing operation of the magnetic memory 100. A magnetization of a part surrounded by the nonmagnetic layer 31 is controlled by applying a write current ($I_{write}$) between the electrode 50 and the electrode 51. A written magnetization depends on a direction of the write current. The written magnetization is in a same direction as either the magnetization of the first fixed magnetization part 32 or the magnetization of the second fixed magnetization part 33, an electron flow $I_e$ (write) being opposite to a direction of the write current. The writing operation is executed by propagating a spin transfer torque from the reference layer 34 to the magnetic thin line 20 via the nonmagnetic layer 31. After writing one bit into the magnetic memory 100, the one bit can be shifted by applying an electric current $I_{shift}$ between the electrode 50 (or the electrode 51) and the electrode 40. An absolute value of $I_{shift}$ is smaller than an absolute value of $I_{write}$. The $I_{shift}$ corresponds to Ie(shift). But a current direction is opposite. A current direction of $I_{shift}$ can be from the electrode 50 or the electrode 51 to the electrode 40, or vice versa. The current direction of $I_{shift}$ can be adjusted by material. By repeating the above writing operation, data is written into the magnetic memory 100.

FIG. 3B is a diagram showing a reading operation of the magnetic memory 100. Magnetization status of the part of the magnetic thin line 20 surrounded by the nonmagnetic layer 31 is read from magnetoresistance when read current ($I_{read}$) is applied between the electrode 50 and the electrode 51. The $I_{read}$ corresponds to Ie(read). But a current direction is opposite. Data is read by use of magnetoresistance effect generated between the reference layer 34 and the magnetic thin line 20 via the nonmagnetic layer 30. One bit is shifted by applying the current $I_{shift}$ between the electrode 50 (or the electrode 51) and the electrode 40. A direction of $I_{shift}$ during reading is opposite to the direction of $I_{shift}$ during writing. An absolute value of $I_{read}$ is smaller than an absolute value of $I_{shift}$. By repeating the above reading operation, data is read from the magnetic memory 100.

The magnetization of the reference layer 34 for the reading operation can be preliminarily fixed. As shown in FIG. 3C, the magnetization of the reference layer 34 is controlled by applying a small set current ($I_{set}$), which is larger than the absolute value of $I_{read}$ and smaller than the absolute value of $I_{shift}$, between the electrode 50 and the electrode 51 (set operation). At this time, an electric current $I_e$ (set) flows opposite to the set current. The magnetization of the reference layer 34 is in a same direction as either the magnetization of the first fixed magnetization part 32 or the magnetization of the second fixed magnetization part 33 that the electron flow $I_e$ (set) passes through. A magnitude relationship of electric current is $|I_{read}|<|I_{set}|<|I_{shift}|<|I_{write}|$.

The writing and reading operation described above are executed by use of a current source circuit that will be explained.

Figure 4A:
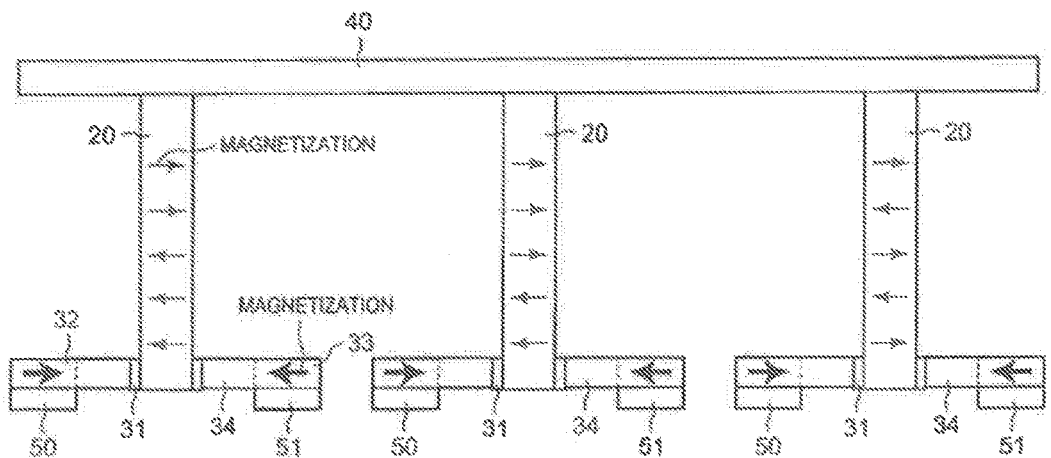
FIG. 4A is a diagram for showing an example of electrodes which are interconnected in a magnetic memory.
Figure 4B:
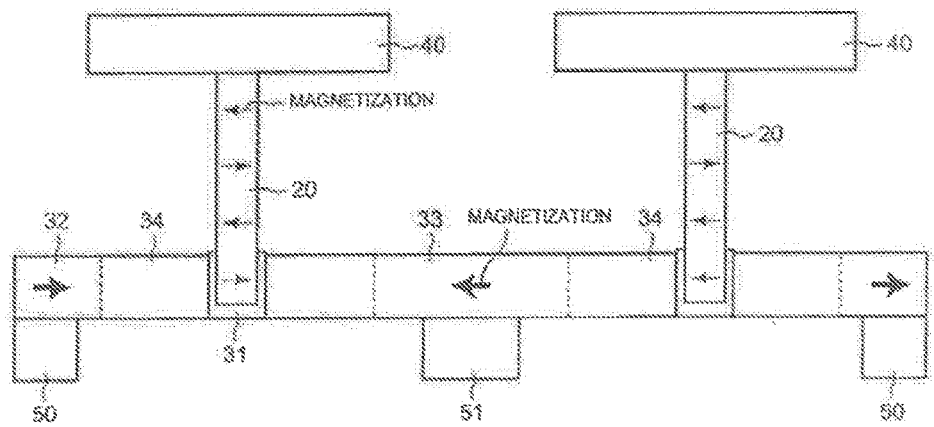
FIG. 4B is a diagram for showing an example of fixed magnetization parts which are interconnected in a magnetic memory.
Figure 4C:
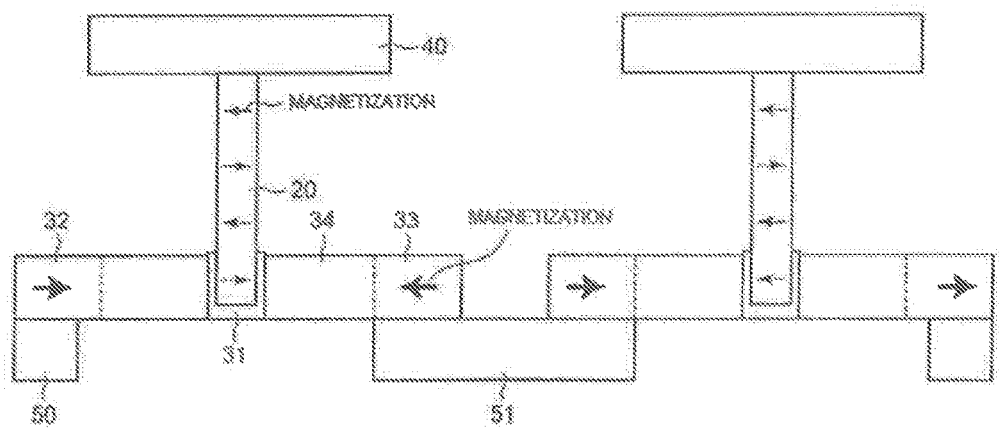
FIG. 4C is a diagram for showing an example of electrodes which are interconnected in a magnetic memory.

As shown in FIG. 4A, the electrode 40 is shared for the magnetic thin line 20 in a case in which where a plurality of the magnetic memories 100 are connected. As shown in FIG. 4B, the fixed magnetization parts 33, 34 can be shared. By sharing the fixed magnetization parts, an occupied area of a substrate when the fixed magnetization parts 33, 34 are shared can be smaller than that of the plurality of the magnetic memories 100 shown in FIG. 4A. There magnetic memory device can have a plurality of the magnetic memories 100. As shown in FIG. 4C, the electrode 51 can be shared.

Figure 5A:
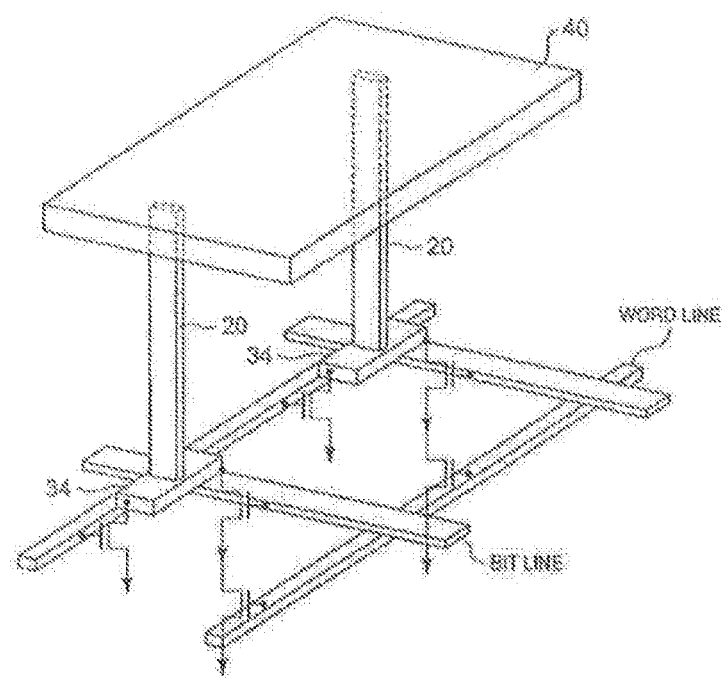
FIG. 5A is a diagram for showing a structure in which a magnetic memory is arranged as an array.

FIG. 5A shows a structure in which the magnetic memory 100 is arranged as an array. In FIG. 5A, the nonmagnetic layer 31, the electrode 40, 50, 51 are omitted to facilitate understanding. In FIG. 5A, the electrode 40 of two magnetic memories 100 is shared. One select transistor or two select transistors are connected to the electrodes 50, 51 of each of the magnetic memory 100. A gate electrode of each of the select transistor is connected to a bit line and a word line.

Figure 5B:
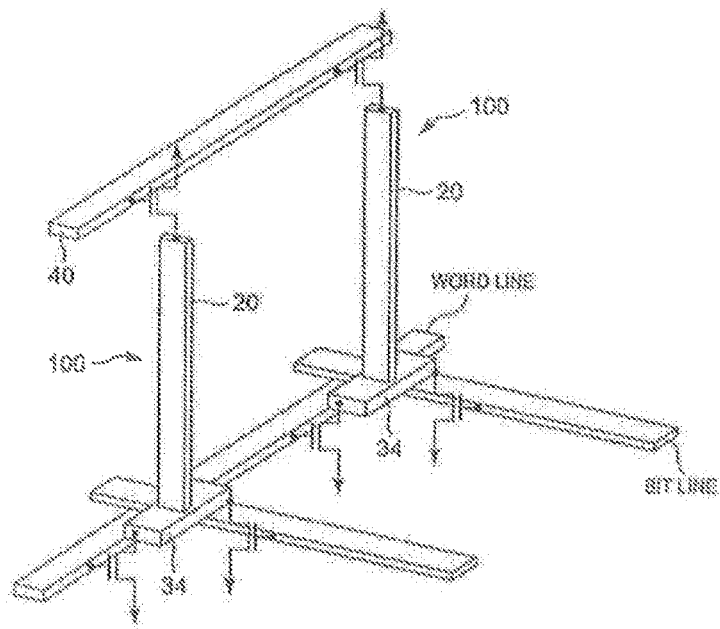
FIG. 5B is a diagram for showing a structure in which a magnetic memory is arranged as an array.

FIG. 5B shows a structure in which the magnetic memory 100 does not share the electrode 40. The electrode 40 is connected to the bit line via the select transistor. The electrodes 50, 51 are connected to the word line via the select transistor. This structure enables to select the magnetic memory 100 by selecting the bit line and the word line.

The structure of in each of FIG. 5A and FIG. 5B is a magnetic memory device because both structures have the plurality of the magnetic memories 100.

Figures 6A, 6B:
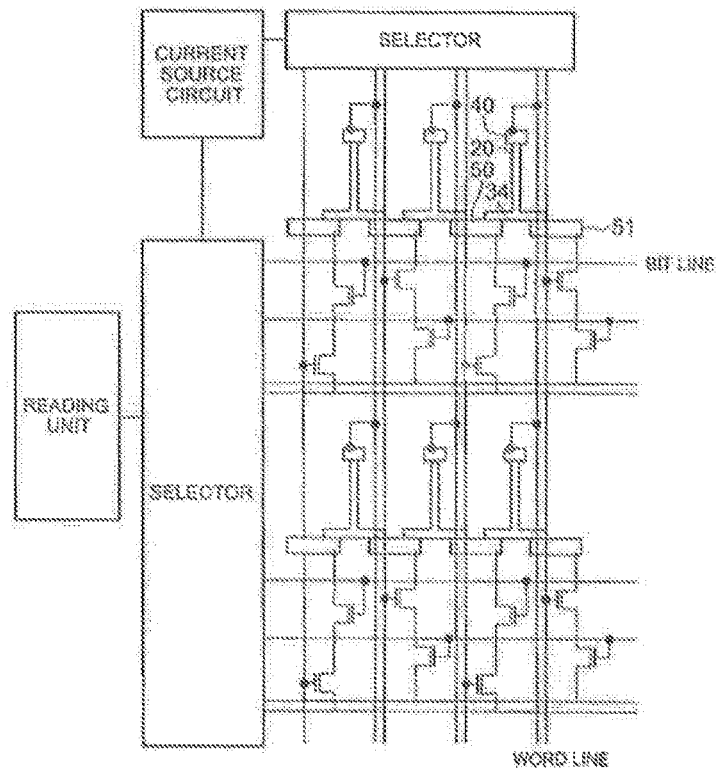
FIG. 6A is a diagram for showing circuits using a plurality of magnetic memories.
FIG. 6B is a diagram for showing circuits using a plurality of magnetic memories.

FIG. 6A and FIG. 6B show diagrams of circuits using the plurality of the magnetic memories 100. The circuit configurations of FIG. 6A and FIG. 6B correspond to the magnetic memory of FIG. 4C sharing the electrodes 50, 51 between the adjacent memories. The circuit configurations can be applied to the magnetic memory of FIG. 4B sharing the fixed magnetization part between the adjacent memories. The bit line and the word line are connected to each selector. Each selector is connected to a current source circuit. One of two selectors is connected to a reading unit.

A fabrication method of the magnetic memory 100 is explained with reference to by use of from FIG. 7a to FIG. 7f. A magnetic thin line is formed by a CVD method depositing magnetic material consisting of multilayer of Co and Ni into a hole of porous alumina formed by anode oxidation (FIG. 7a). Instead of the CVD method, an ALD method can be used for this process. A part of the magnetic thin line is exposed by etching one side of a porous alumina ($AlO_x$) (FIG. 7b).

A nonmagnetic layer consisting of MgO is deposited so that the alumina and the part of the magnetic thin line are covered. A reference layer consisting of CoFe is deposited on the nonmagnetic layer (FIG. 7c).

The reference layer is etched until a surface of the nonmagnetic layer is exposed (FIG. 7d).

A mask is formed by electron beam (EB) drawing after applying a resist on a part of the exposed surface. Ultrathin CoFe film, Ru film, CoFe film, and IrMn film are formed in this order on the exposed surface and the mask. These magnetic layers correspond to a fixed magnetization part. One of two fixed magnetization parts is formed by removing the mask (FIG. 7e). A mask is formed by EB drawing after applying a resist on the part of the exposed surface again. Ultrathin CoFe film and IrMn film are formed in this order on the exposed surface and the mask. These magnetic layers correspond to the other fixed magnetization part. The other fixed magnetization part is formed by removing the mask. A space between the fixed magnetization parts is buried with an insulating layer. An electrode is formed on the fixed magnetization parts by liftoff (FIG. 7f).

An electrode consisting of Cr/Au is formed so that the electrode is contacted to a magnetic thin line that the magnetic thin line is not processed (FIG. 7g).

A plane in which the electrode of the reference layer is formed is contacted to a substrate having a select transistor and lines. At this time, a position of the lines corresponds to a position of the electrode.

By these means, the magnetic memory 100 is fabricated.

This embodiment can provide a magnetic memory, a magnetic memory device, and a method of reading and writing the magnetic memory which enables to fix easily a position adjustment of a magnetic thin line and has a reading element and a writing element being able to perform a signal access.

Figure 8A:
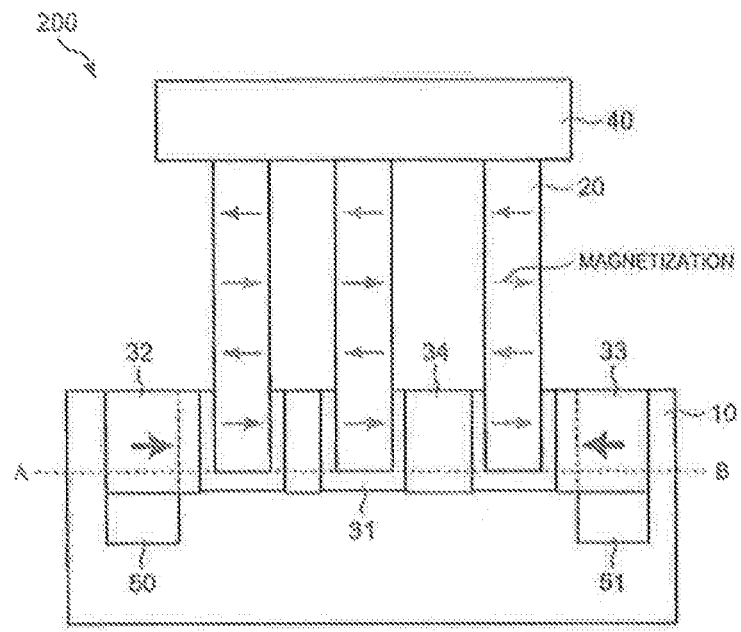
FIG. 8A is a diagram for showing a magnetic memory.
Figure 8B:
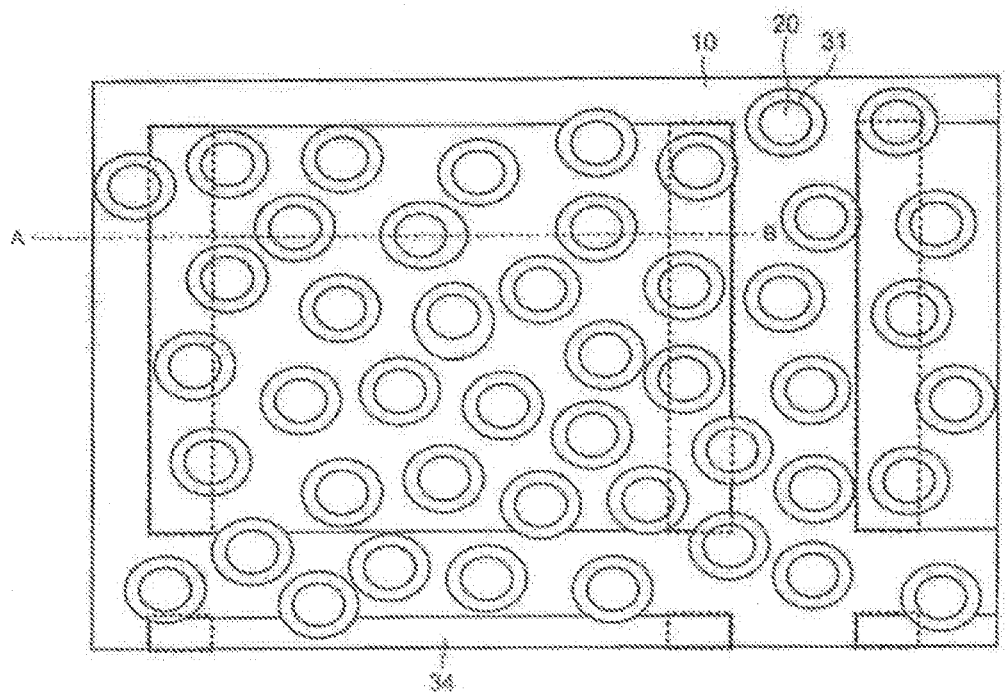
FIG. 8B is a diagram for showing a cross-sectional view at A-B in FIG. 8A.

FIG. 8A shows a magnetic memory 200. A point that a plurality of magnetic thin lines 20 is provided between the first fixed magnetization part 32 and the second fixed magnetization part 33 is different from the magnetic memory 100. FIG. 8B shows a cross-sectional view at A-B in FIG. 8A. The plurality of the magnetic thin lines 20 corresponds to one writing/reading part 30 (not shown). At one end of each magnetic thin line 20, the nonmagnetic layer 31 is provided between the reference layer 34 and the magnetic thin line 20. The electrode 40 is provided on the other end of each magnetic thin line 20. This structure enables easily adjusting a position of the magnetic thin line 20 and the writing/reading part 30 because a width of the magnetic thin line 20 is sufficiently smaller than that of the reference layer 34.

In the magnetic memory 200, data is written into the plurality of the magnetic thin lines 20 connected to one layer of the reference layer 34 at the same time. An average of data information written in to the plurality of the magnetic thin lines is read. One bit shift is executed for the plurality of the magnetic thin lines 20 as one unit. Executing the plurality of the magnetic thin lines 20 as one unit enables reduction of errors or defects for the writing and reading operation.

Figure 9A:
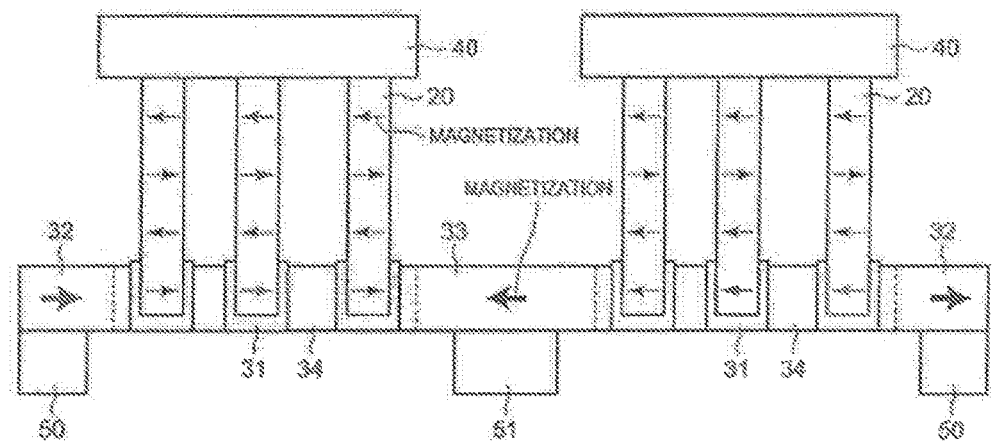
FIG. 9A is a diagram for showing a magnetic memory device sharing a fixed magnetization part of a magnetic memory.
Figure 9B:
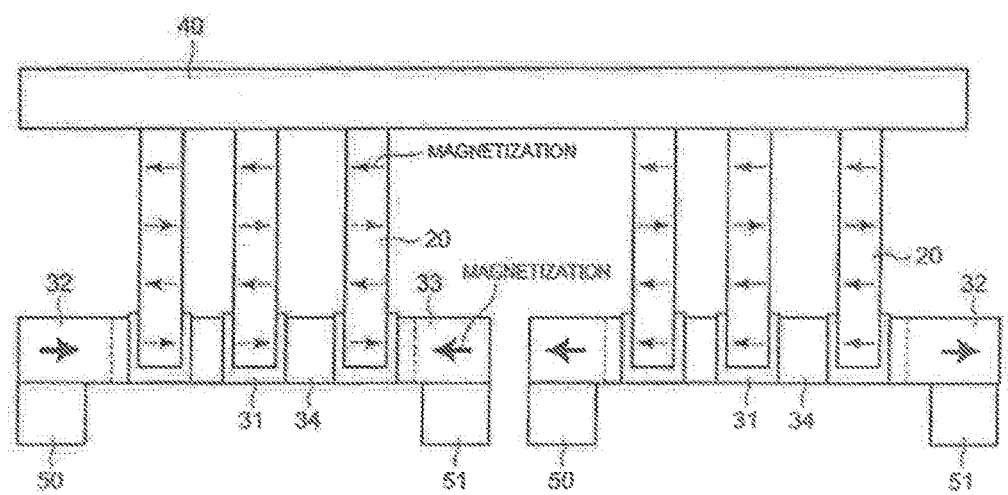
FIG. 9B is a diagram for showing a magnetic memory device sharing a fixed magnetization part of a magnetic memory.

FIG. 9A shows a magnetic memory device sharing a fixed magnetization part of the magnetic memory 200. FIG. 9B shows a magnetic memory device sharing an electrode 40 of the magnetic memory 200.

The word "Perpendicular" and "parallel" mean substantially perpendicular and substantially parallel because variation may occur during fabrication.

Although the exemplary embodiments of the present invention have been described above, these embodiments are presented just as examples, and it is not intended to limit a range of the invention. New embodiments may be carried out with other various modes, and a variety of omissions, replacements, and modifications may be made within a range that does not deviate from the invention. These embodiments and their modifications are included in the scope of the claims of the invention and their equivalents.

What is claimed is:

1. A magnetic memory, comprising:
    a magnetic thin line including a plurality of magnetic domains;
    a reference layer having a magnetization and surrounding one end of the magnetic thin line;
    a nonmagnetic layer provided between the reference layer and the magnetic thin line;
    a first fixed magnetization part having a magnetization and a second fixed magnetization part having a magnetization, provided at both ends of the reference layer, wherein the magnetization of the first fixed magnetization part is opposite to the magnetization of the second fixed magnetization part;
    a first electrode provided at the first fixed magnetization part,
    a second electrode provided at the second fixed magnetization part; and
    a third electrode provided at an other end of the magnetic thin line.

2. The magnetic memory of claim 1, further comprising:
    an antiferromagnetic layer provided between the first fixed magnetization part and the first electrode.

3. The magnetic memory of claim 1, wherein at least one of the magnetization of the magnetic thin line, the magnetization of the first fixed magnetization part, and the magnetization of the second magnetization part has a magnetization easy axis in a direction intersecting a direction of connecting the first electrode and the second electrode.

4. The magnetic memory of claim 2, wherein at least one of the magnetization of the magnetic thin line, the magnetization of the first fixed magnetization part, and the magnetization of the second magnetization part has a magnetization easy axis in a direction intersecting a direction of connecting the first electrode and the second electrode.

5. The magnetic memory of claim 1, wherein the nonmagnetic layer comprises at least one material selected from a group of copper, silver, gold, aluminum, and platinum, a combination alloy related to these materials, an oxide, a nitride, or graphite.

6. The magnetic memory of claim 2, wherein the nonmagnetic layer comprises at least one material selected from a group of copper, silver, gold, aluminum, and platinum, a combination alloy related to these elements, an oxide, a nitride, or graphite.

7. The magnetic memory of claim 3, wherein the nonmagnetic layer comprises at least one material selected from a group of copper, silver, gold, aluminum, and platinum, a combination alloy related to these elements, an oxide, a nitride, or graphite.

8. The magnetic memory of claim 4, wherein the nonmagnetic layer comprises at least one material selected from a group of copper, silver, gold, aluminum, and platinum, a combination alloy related to these elements, an oxide, a nitride, or graphite.

9. The magnetic memory of claim 1, further comprising:
    means to apply an electric current between the first electrode and the second electrode;
    means to apply an electric current between the second electrode and the third electrode;
    means to read a resistance between the first electrode and the second electrode.

10. The magnetic memory of claim 2, further comprising:
    means to apply an electric current between the first electrode and the second electrode;
    means to apply an electric current between the second electrode and the third electrode;
    means to read a resistance between the first electrode and the second electrode.

11. The magnetic memory of claim 3, further comprising:
    means to apply an electric current between the first electrode and the second electrode;
    means to apply an electric current between the second electrode and the third electrode;
    means to read a resistance between the first electrode and the second electrode.

12. The magnetic memory of claim 4, further comprising:
    means to apply an electric current between the first electrode and the second electrode;
    means to apply an electric current between the second electrode and the third electrode;
    means to read a resistance between the first electrode and the second electrode.

13. The magnetic memory of claim 5, further comprising:
    means to apply an electric current between the first electrode and the second electrode;
    means to apply an electric current between the second electrode and the third electrode;
    means to read a resistance between the first electrode and the second electrode.

14. A magnetic memory device, comprising:
    a first magnetic memory comprising:
        a first magnetic thin line including a plurality of magnetic domains;
        a first reference layer having a magnetization and surrounding one end of the first magnetic thin line;
        a first nonmagnetic layer provided between the first reference layer and the first magnetic thin line;
        a first fixed magnetization part having a magnetization and a second fixed magnetization part having a magnetization; provided at both ends of the first reference layer, wherein the magnetization of the first fixed magnetization part is opposite to the magnetization of the second fixed magnetization part;
a first electrode provided at the first fixed magnetization part;
a second electrode provided at the second fixed magnetization part; and
a third electrode provided at other end of the first magnetic thin line; and a second magnetic memory comprising:
a second magnetic thin line including a plurality of magnetic domains;
a second reference layer having a magnetization and surrounding one end of the second magnetic thin line;
a second nonmagnetic layer provided between the second reference layer and the second magnetic thin line;
a third fixed magnetization part having a magnetization and a fourth fixed magnetization part having a magnetization, provided at both ends of the second reference layer, wherein the magnetization of the third fixed magnetization part is opposite to the magnetization of the fourth fixed magnetization part;
a fourth electrode provided at the first fixed magnetization part;
a fifth electrode provided at the second fixed magnetization part; and
a sixth electrode provided at other end of the second magnetic thin line.

15. The magnetic memory device of claim 14, wherein the third electrode and the sixth electrode are interconnected.

16. The magnetic memory device of claim 14, wherein the first electrode and the fourth electrode are interconnected.

17. The magnetic memory device of claim 14, wherein the first reference layer and the second reference layer are interconnected.

* * * * *